United States Patent [19]

Hill

[11] 3,775,695

[45] Nov. 27, 1973

[54] PHASE LOCK LOOP FOR A VOLTAGE CONTROLLED OSCILLATOR

[75] Inventor: Charles W. Hill, Linthicum Heights, Md.

[73] Assignee: Westinghouse Electric Corporation, Pittsburgh, Pa.

[22] Filed: Dec. 27, 1968

[21] Appl. No.: 787,390

[52] U.S. Cl. .......... 331/4, 331/8, 331/25

[51] Int. Cl. .......... H03b 3/06

[58] Field of Search .......... 331/8, 111, 4, 17, 331/1; 307/295, 301

[56] References Cited

UNITED STATES PATENTS

| | | | |
|---|---|---|---|
| 3,576,498 | 4/1971 | Hirsch | 331/4 |
| 2,896,074 | 7/1959 | Newsom et al. | 331/4 |
| 2,951,150 | 8/1960 | Rennenkampf | 331/4 |
| 3,189,844 | 6/1965 | MacKenzie | 331/4 |

*Primary Examiner*—Benjamin A. Borchelt
*Assistant Examiner*—H. A. Birmiel
*Attorney*—F. H. Henson and E. P. Klipfel

[57] ABSTRACT

A phase locked voltage controlled oscillator having an automatic sweep and lock-up circuit employing a unijunction transistor relaxation oscillator as the controlling device in the circuit.

9 Claims, 3 Drawing Figures

PATENTED NOV 27 1973

3,775,695

INVENTOR
CHARLES W. HILL

BY Ernest P. Klipfel
ATTORNEY

PHASE LOCK LOOP FOR A VOLTAGE CONTROLLED OSCILLATOR

BACKGROUND OF THE INVENTION

The invention herein described was made in the course of or under a contract or subcontract thereunder with the U. S. Air Force Systems Command - Contract F33657–67–C–0344.

Where it is desirable to have a voltage-controlled variable frequency oscillator run at the same frequency as another oscillator, a phase lock servo loop is frequently employed. One such application for this type of electronic circuitry is in radar systems, wherein a system oscillator is locked in phase with the doppler frequency of a target being tracked in the receiver.

In many cases, a servo loop cannot be readily designed with sufficient pull-in range or response to lock on the incoming signal. This being the case, the controlled oscillator output is usually swept in frequency by some externally generated waveform until its frequency comes within the loop pull-in range of the incoming signal frequency and lock up is achieved. This is usually accomplished by means of a phase detector and an integrator circuit being operable so that when the beat frequency as seen at the output of the phase detector is of a value that the integrator can respond to it, the frequencies are said to be within loop pull-in range of one another. However, this condition must be sensed somewhere in the receiver, and a command is thereupon generated to cause the sweeping circuits to become inoperative. On the other hand, if lock up is lost for any reason, such as target fade or noise interference, the process must be reinitiated after some finite time delay caused by the lock-up sensing circuits.

The normal manner in which the sweep circuit is designed for a swept oscillator is to employ a controlled astable multivibrator which is started and stopped in accordance with a sweep and lock up circuit coupled back to the receiver and controlled thereby and wherein the output of the multivibrator is fed to an integrator circuit within the servo loop producing a ramp voltage which is then applied to the voltage controlled oscillator until pull-in or phase lock is achieved whereupon the free-running multivibrator is stopped by a "sweep stop" circuit. The multivibrator, however, must be turned on and off, or be connected in and out of the loop every time lock up is lost or achieved.

SUMMARY

The present invention is directed to a simpler, faster and less complex sweep and lock circuit for a phase-locked oscillator wherein a servo loop is employed to feed a control voltage in the form of a ramp signal to cause the voltage controlled oscillator to sweep in frequency until phase lock occurs and then providing a constant voltage for maintaining the frequency of the oscillator at the proper value to maintain phase lock. The servo loop is comprised of an integrator circuit coupled between the output of a phase detector which determines the phase angle difference between the incoming signal and the output of a voltage controlled oscillator and to the input of the voltage controlled oscillator. A unijunction transistor relaxation oscillator is coupled in a control loop around integrator circuit and is biased such that when the output of the integrator is in a first condition corresponding to lock up, the relaxation oscillator is inoperative; however, when lock up is lost, the output of the integrator circuit changes to a second condition whereupon the output of the unijunction relaxation oscillator is automatically rendered operative and provides an impulse signal to the input of the integrator causing a ramp signal to be generated by the integrator for sweeping the output frequency of the voltage-controlled oscillator until the pull-in range for lock-up is again reached.

DESCRIPTION OF THE PREFERRED EMBODIMENTS

Figure 1:
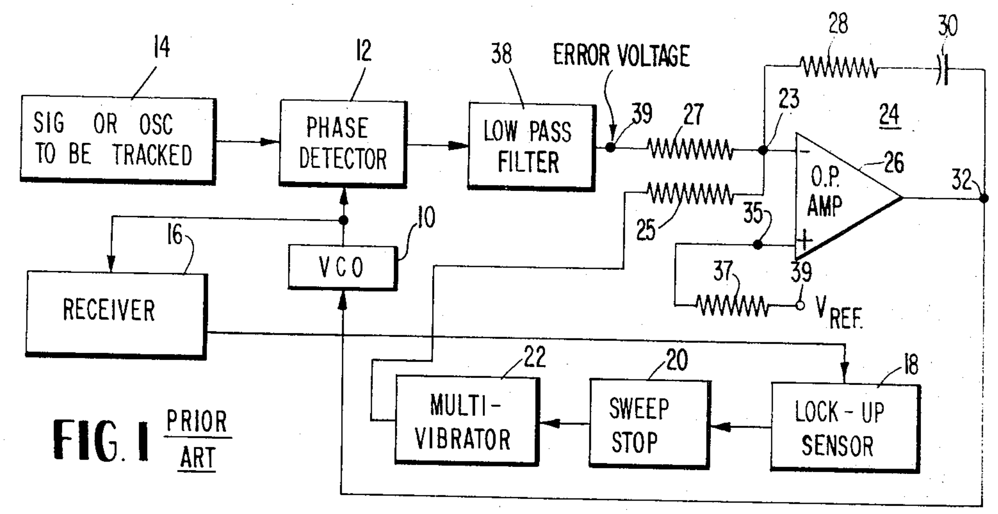
FIG. 1 PRIOR ART
FIG. 1 is a block diagram of a phase locked voltage-controlled oscillator including a phase lock servo loop typical of the known prior art.

Referring to the drawings and, more particularly, to FIG. 1, there is disclosed a typical prior art phase locked voltage-controlled variable frequency oscillator including the phase lock servo loop, and which may be used, for example, in a radar system. Briefly, the block diagram includes a voltage controlled oscillator 10 coupled to a phase detector 12, which in turn receives a second input from a signal source or oscillator 14 to which it is desirable to phase lock the voltage controlled oscillator 10. The output of the voltage controlled oscillator is additionally fed to a receiver 16, which couples an output to a lock up sensor 18 for determining the operating condition of the system. The lock-up sensor 18 is coupled into a sweep-stop circuit 20, which controls a free-running multivibrator circuit 22, the output of which is fed to one input (−)23 of an integrator circuit 24 by a resistor 25. The integrator circuit is comprised of an operational amplifier 26 and an RC Miller feedback circuit including resistor 28 and capacitor 30. This Miller feedback circuit is coupled from the output terminal 32 of the operational amplifier 26 to the input terminal 23 which is the input used for inversion of the input signal in the amplifier. Terminal 23 is also coupled to a low-pass filter 38 by means of a resistor 27 connected to terminal 39.

In operation, it is desirable to phase lock the voltage controlled oscillator 10 to the signal source 14. The receiver 16 couples a signal to the lock up sensor 18 for controlling the sweep-stop circuit 20 and the multivibrator 22. In the event that phase lock is not present, the output of the phase detector 12 provides an error voltage at the output terminal 39 of the low-pass filter 38 which is coupled to input terminal 23 of the operation amplifier 26. The multivibrator 22 becomes fully activated by action of the receiver 16 causing the integrator circuit 24 to produce a ramp signal at terminal 32 which is applied to the voltage controlled oscillator 10 to cause its output frequency to sweep. When phase coincidence occurs, the receiver 16 will couple a signal to the lock up sensor whereupon the sweep-stop circuit 20 deactivates the multivibrator 22.

Figures 2, 3:
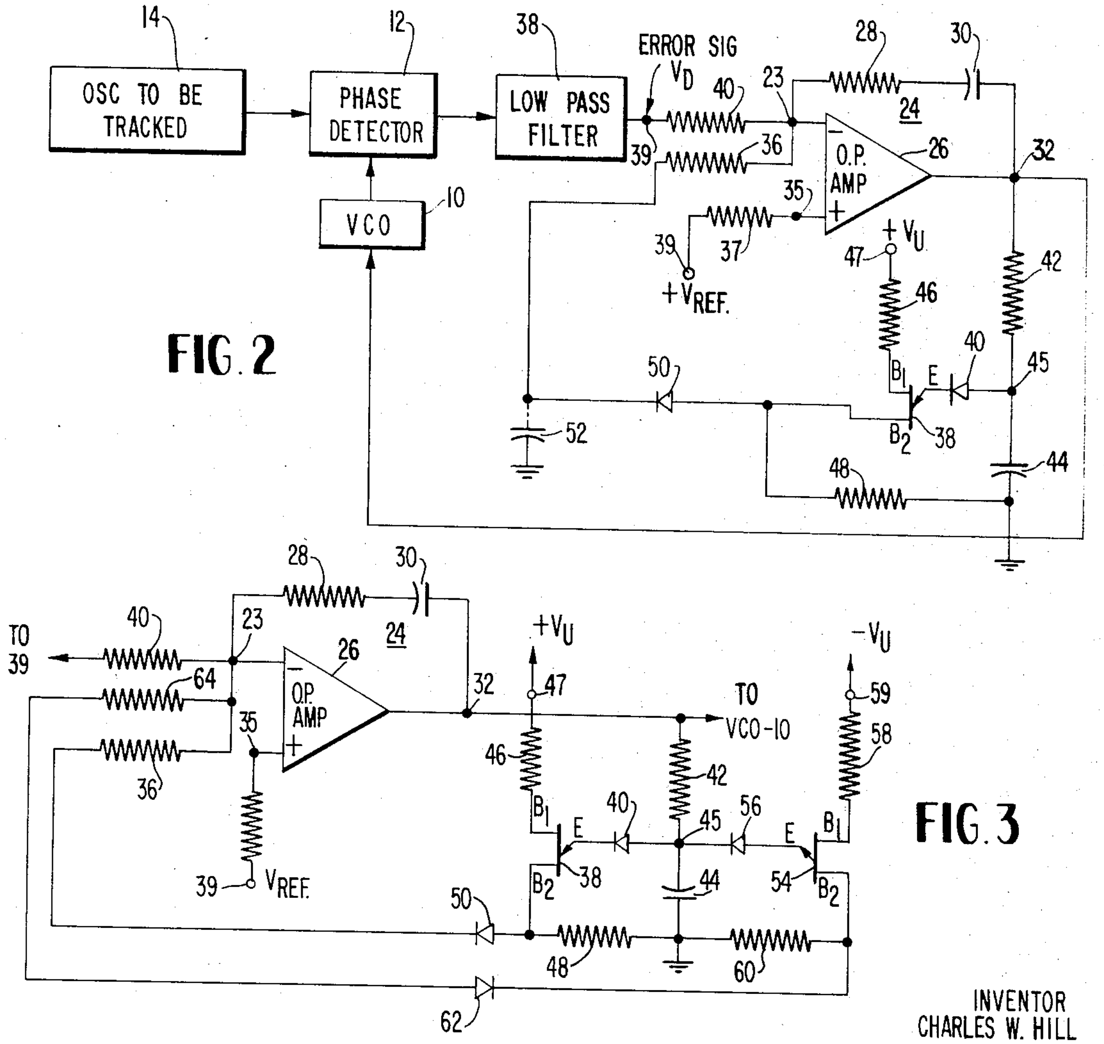
FIG. 2 is a block diagram of one embodiment of the subject invention.
FIG. 3 is a partial block diagram of a second embodiment of the subject invention.

Proceeding now to the preferred embodiment of the subject invention, attention is directed to FIG. 2, which is similar to the circuit shown in FIG. 1 with the exception that the lock up sensor 18, the sweep-stop circuit 20 and the multivibrator circuit 22 is replaced by a single unijunction transistor relaxation oscillator coupled between the output terminal 32 of the operational amplifier 26 and the (—) input terminal 23. More particularly, the emitter electrode E of a unijunction transistor 38 is coupled by means of the diode 40 to the junction of resistor 42 and capacitor 44, which in turn is connected across the output terminal 32 and ground potential. The value of components 42 and 44 determines the frequency of the relaxation oscillator provided thereby when resistors 46 and 48 are connected to the base electrodes $B_1$ and $B_2$. Accordingly, the base $B_1$ is coupled to a predetermined bias potential $+V_u$ by means of resistor 46. The output electrode of transistor 38, which is the base $B_2$, has a resistor 48 coupled to ground potential. A diode 50 is coupled back to the input terminal 23 by means of the resistor 36.

In operation, the integrator operational amplifier 26 is biased by means of a positive reference voltage V REF applied to the + terminal 35 so that it will saturate the operational amplifier 26 in a positive direction when an error signal $V_D$ having a beat frequency within the pull-in range of the integrator 24 appears at terminal 39. The unijunction transistor 38 meanwhile is positively biased by means of the voltage $+V_u$ so that the voltage during lock up appearing at its emitter E is less than $+nVu$ where $n$ is the intrinsic stand-off ratio of the unijunction transistor 38. This renders the transistor non-conductive. In the event that unlock occurs the voltage at terminal 32 goes more positive until saturation is reached whereupon the emitter voltage at the emitter E has a value greater than $+nVu$ and the unijunction transistor 38 becomes conductive.

When the emitter voltage reaches nVu, capacitor 44 dumps its charge into resistor 48 causing a voltage spike to appear thereacross. The capacitor then recharges through resistor 42 until the emitter voltage again reaches $nVu$. The intrinsic stand-off ratio n is typically in the range of 0.6 – 0.85. The voltage at junction 32 however must be equal to or greater than $nVu$ or the unijunction transistor 38 will not fire. The spike that appears at the base $B_2$ is immediately coupled to the input + terminal 23 at which time the operational amplifier is driven immediately into negative saturation and a positive-going ramp voltage is then produced according to the RC time constant of the resistor 28, the capacitor 30 and resistor 36. The positive-going ramp voltage at terminal 32 is coupled to the voltage controlled oscillator 10 causing it to sweep in frequency until the error voltage $V_D$ is reduced in frequency to predetermined value, for example zero, whereupon the voltage at terminal 32 will again assume a stable voltage level with prevents the unijunction transistor 38 from further conduction. This condition is referred to as lock up.

If the voltage at terminal 32 and more particularly at junction 45 is never required to swing more than $\pm V_1$ volts in the normal closed loop or lock up condition, the unijunction transistor 38 must be biased so that it will not fire with less than $V_1$ volts applied to its emitter. To have the unijunction transistor 38, on the other hand, conduct when the integrator output at terminal 32 exceeds $V_1$, it is necessary to make the bias voltage $V_u = V_1/n$. When the loop is locked, the voltage at terminal 32 is less than $V_1$ and the unijunction cannot fire. If the loop should open, however, the reference voltage V REF applied to the input terminal 35 causes the output voltage at terminal 32 to saturate at a level of $+V_2$ volts, where $V_2$ is greater than $V_1$ ($V_2 > V_1$). The reference voltage V REF applied to terminal 39, accordingly, is set at a voltage which is slightly more positive than the average output of the phase detector 12 when the beat frequency is too high for lock up. This condition assures that the integrator output will always be saturated in the positive direction when the loop is open.

The low pass filter 38 is included in the circuit so that the loop will not respond to high frequency disturbances which would cause phase jitter on the voltage controlled oscillator 10 when lock-up exists.

This configuration, as illustrated in FIG. 2, will automatically begin operation without any outside command whereas a receiver signal is required in the prior art embodiments shown in FIG. 1 to reinitiate lock up. The embodiments shown in FIG. 2 thus can acquire lock up unaided by any of the receiver circuits as long as the frequency with which phase lock is desired is present at the phase detector 12 input.

The diode 40 protects the unijunction transistor 38 from excessive back bias. When desirable, a capacitor 52 can be coupled from the common connection between the resistor 36 and the diode 50 to trap some charge from the pulse appearing at the base $B_2$ if the sleeving rate of the operational amplifier 26 is too slow to change output polarity when the pulse from $B_2$ is coupled to the — input terminal 23. Diode 50 has a twofold purpose: a.) When capacitor 52 is used to trap charge from the unijunction impulse, the diode prevents the charge from leaking to ground through the relatively low impedance base resistor 48. b.) It prevents input offset current from the integrated circuit 26 from leaking to ground through resistors 36 and 48. For low offset out of integrator 26 it is desirable that both inputs see the same DC impedance looking out. If resistor 40 equals resistor 37 then it is not desirable to see the combination of resistor 36 and resistor 48 in parallel with resistor 40. The diode prevents this because it exhibits a high series impedance.

When desirable, a second identical unijunction transistor but one having opposite conductivity can be coupled to the configuration shown in FIG. 2 where it is desirable to produce a ramp output at terminal 32 irrespective of whether the operational amplifier 26 saturates either in a positive or negative direction. Such a configuration is shown in FIG. 3, wherein a second unijunction transistor 54 having opposite conductivity from the unijunction transistor 38 has its emitter E coupled to the junction 45 by means of the diode 56 just as in the case of the unijunction 38. A resistor 58 is coupled from the base $B_1$ to bias potential $-V_u$. However, it should be observed that, whereas in the former embodiment, a positive bias potential $V_u$ is applied, the present bias potential must have a negative value of $V_u$. The output is taken from the base $B_2$ across the resistor 60, which is then coupled to the input terminal 23 of the operational amplifier 26 by means of the diode 62 and the resistor 64. The circuitry shown in FIG. 3 will pull the integrator 24 away from saturation in either direction. A time constant for both unijunction transistors 38 and 54 is determined by the resistor 42 and the capacitor 44 is made sufficiently long so that either unijunction transistor would not conduct again until the natural offset in the loop had time to ramp the integrator 24 back to its original condition.

What has been shown and described therefore is an improved phase lock loop for voltage controlled oscillators which requires no stimulus external to the phase lock loop to acquire lock up.

While the present invention has been shown and described with a certain degree of particularlity, the foregoing specification is not meant to be interpreted in a limiting sense, since it is to be understood that all alterations, modifications and equivalents coming within the spirit and scope of the invention are herein meant to be included.

I claim as my invention:

1. In a phase lock servo loop for a voltage controlled oscillator, the output frequency of which is swept in an unlocked mode for comparison with an external signal to be tracked by means of a phase detector with the sweep being terminated when phase lock is obtained, the combination comprising:

an integrator circuit including first circuit means, having a first and a second input terminal for inverting and non-inverting a signal respectively applied thereto and an output terminal, and an RC feedback circuit coupled between said first input terminal and said output terminal;

second circuit means coupled to said second input terminal of said integrator circuit for applying a reference voltage thereto, third circuit means for coupling the output terminal of said integrator circuit to the input of said voltage controlled oscillator;

a phase detector circuit coupled to and including means for receiving the output of said voltage controlled oscillator and said external signal and providing an error signal in accordance with the phase comparison thereof;

fourth circuit means coupling said error signal to said first input terminal of said integrator circuit;

and transistor means having an input and an output electrode and including means coupling said input electrode to said output terminal of said integrator circuit and the output electrode to said first input terminal of said integrator circuit, and electrical bias means coupled to said transistor means for rendering said transistor means non-conductive when said error signal is of a predetermined magnitude indicative of a lock up condition, but becoming conductive when said error signal exceeds a second predetermined level indicative of an unlocked condition whereupon said transistor means generates and couples a signal to said first input terminal and said integrator circuit generates a sweep signal for varying the frequency of said voltage controlled oscillator until said error signal reaches said first predetermined value.

2. The invention as defined by claim 1 wherein said fourth circuit means comprises a low-pass filter.

3. The invention as defined by claim 2 wherein said transistor means comprises at least one unijunction transistor and wherein said input electrode comprises the emitter electrode thereof and the output electrode comprises one base electrode.

4. The invention as defined by claim 2 wherein said transistor means comprises a unijunction transistor wherein said input electrode comprises the emitter electrode and said output electrode comprises one base of two base electrodes, said means coupling said input electrode of said transistor means to said output terminal of said integrator comprises a series resistance-capacitance circuit having a common junction therebetween and including means for coupling one end of said series circuit to said output terminal of said integrator and the other end to a point of reference potential and means for coupling said common junction to said emitter electrode, resistance means coupled from said one base electrode to said point of reference potential, and electrical bias means including a resistor coupled from the other base electrode of said two base electrodes to a bias potential having a selected value greater than said first predetermined voltage appearing at the output of said integrator circuit.

5. The invention as defined by claim 4 and additionally including diode means coupled between said one base electrode of said unijunction transistor and said first input terminal of said integrator circuit.

6. The invention as defined by claim 4 and additionally including diode means coupled between said emitter electrode and said common junction.

7. The invention as defined by claim 4 and additionally including a second unijunction transistor including an emitter electrode and two base electrodes and wherein said output electrode comprises one base electrode, electrical bias means includes a predetermined potential of opposite polarity from said bias potential applied to the other unijunction transistor coupled to the other base electrode of said second unijunction transistor and means coupling said emitter electrode to said common junction between said series resistance-capacitance circuit.

8. The invention as defined by claim 5 wherein said electrical bias means includes a bias potential having a value substantially equal to a first predetermined voltage divided by the intrinsic stand off ratio of said unijunction transistor.

9. The invention as defined by claim 1 wherein said first circuit means comprises an operational amplifier.

* * * * *